United States Patent [19]

Goronkin

[11] Patent Number: 5,289,013
[45] Date of Patent: Feb. 22, 1994

[54] PHONON AND CHARGE CARRIER SEPARATION IN QUANTUM WELLS

[75] Inventor: Herbert Goronkin, Tempe, Ariz.

[73] Assignee: Motorola, Inc., Schaumburg, Ill.

[21] Appl. No.: 769,659

[22] Filed: Oct. 2, 1991

[51] Int. Cl.⁵ .............................................. H01L 29/78
[52] U.S. Cl. ...................................... 257/14; 257/17; 257/20; 257/192
[58] Field of Search ................ 257/23, 192, 196, 416, 257/14, 17, 20, 22

[56] References Cited

U.S. PATENT DOCUMENTS 5,160,982 11/1992 Goronkin et al. .................... 257/23

FOREIGN PATENT DOCUMENTS 1-225175 9/1989 Japan ..................................... 257/20
1-241866 9/1989 Japan ..................................... 257/9

Primary Examiner—Sara W. Crane
Attorney, Agent, or Firm—Aaron Bernstein; Joe E. Barbee

[57] ABSTRACT

A quantum well structure having a host optical phonon confinement well (11) having a characteristic phonon distribution (16), and at least one charge carrier confinement well (17) located near a minima of the phonon distribution (16). In one embodiment, a wide bandgap layer (13) is formed in a central portion of the host optical phonon confinement well (11), wherein the wide bandgap layer (13) has phonon properties closely matching that of the host phonon confinement well (11).

13 Claims, 1 Drawing Sheet

PHONON AND CHARGE CARRIER SEPARATION IN QUANTUM WELLS

BACKGROUND OF THE INVENTION

This invention relates, in general, to quantum well devices, and more particularly, to a high mobility quantum well structure.

Semiconductor devices, such as bipolar and field effect transistors, can consist of multiple layers of semiconducting or insulating materials. Charge carriers (holes and electrons) move through the layers of the semiconductor device. Performance and efficiency of the semiconductor device is largely determined by mobility of the charge carriers in the semiconductor layers.

Bulk semiconductor materials have characteristic mobility which determines usefulness of the semiconductor material for device processing. Compound semiconductors, for example, are known to have higher mobility than silicon and thus are preferred for high performance devices. Characteristic mobility of a semiconductor material, however, is degraded by crystal imperfections, doping impurities, and the like. Mobility also decreases as a result of interactions of charge carriers with phonons of the crystal lattice.

While extensive work has been done to reduce mobility degradation caused by impurities and defects in semiconductors, it has been widely accepted that mobility degradation caused by charge carrier interaction with bulk phonons can not be reduced. In addition to phonons associated with bulk materials, interface phonons are generated at an interface between semiconductor layers of different composition. In the past, it was believed that mobility degradation caused by electron-phonon interactions was best limited by designing structures with as few interfaces, and thus as few semiconductor layers as possible.

In a bulk material electrons and phonons are distributed uniformly. Interaction between the two is proportional to the product of the densities and it is thus constant throughout the sample. What is needed is a semiconductor material structure which separates charge carrier and phonon distributions, reducing electron-phonon interaction and improving mobility.

SUMMARY OF THE INVENTION

Briefly stated, the present invention is achieved by an enhanced mobility semiconductor comprising a host optical phonon confinement well having a characteristic phonon distribution, and at least one charge carrier confinement well located near a minima of the phonon distribution. In one embodiment, a wide bandgap layer is formed in a central portion of the host optical phonon confinement well, wherein the wide bandgap layer has phonon properties closely matching that of the host phonon confinement well material.

As used herein the word(s) "phonon confinement well", or "phonon well", singular or plural, mean a multi-layer structure having a central portion in which phonons are confined in two dimensions. The words "barrier layer" refer to a wide bandgap material formed at an edge of a quantum well for confining charge carriers in the quantum well.

DETAILED DESCRIPTION OF THE DRAWINGS

Co-pending U.S. patent application Ser. No. 724,014 filed on Jul. 1, 1991 and assigned to the same assignee as this invention describes a quantum well structure which confines phonons in two dimensions while allowing charge carrier movement in three dimensions. In the instant invention, charge carriers are confined in a two dimensional quantum well, and phonons are confined in a two dimensional phonon well. The phonon well and quantum wells are designed such that the charge carrier distribution is at a maximum near the minima of the phonon distribution. Thus, charge carrier interaction with phonons is minimized.

Figure 1:
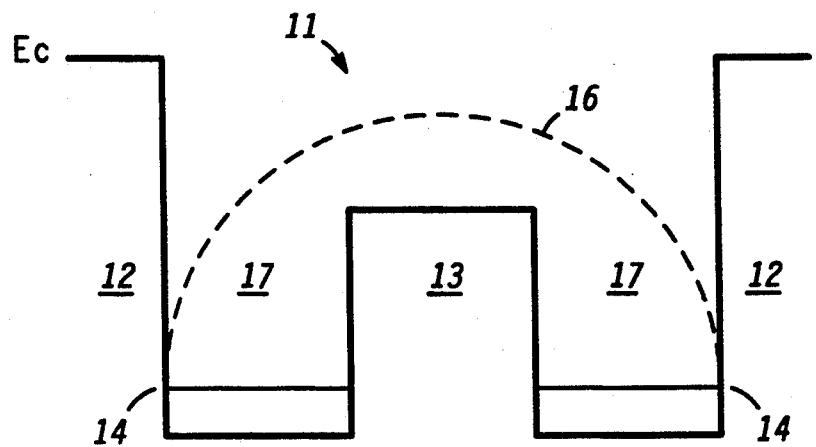
FIG. 1 illustrates a highly simplified band diagram illustrating an embodiment of the present invention.

FIG. 1 illustrates a highly simplified conduction band diagram illustrating a portion of a structure in accordance with the present invention. It should be understood that the conduction band diagram of FIG. 1 is extremely simplified for ease of description and that various anomalies which actually appear in a conduction band of a semiconductor device are not illustrated. The high mobility semiconductor structure of the present invention would be used in an electronic device as a channel region of a heterojunction field effect transistor, for example. Other applications for the present invention will be apparent to those of skill in the art.

Although the preferred embodiments of the present invention are described in terms of a device where the charge carriers are electrons, it should be understood that devices having holes as charge carriers may also be used. Although referred to as an enhanced conductivity semiconductor structure, it should be understood that semi-insulating compound materials may be used where appropriate. A great deal of latitude is available in material choice so long as the energy band relationships, material phonon properties, and other solid state characteristics described hereinbelow are maintained. Accordingly, these variations are within the scope of the present invention.

FIG. 1 illustrates a host phonon well 11 in which phonons are confined by barrier layers 12. Barrier layers 12 comprise a material with different phonon characteristics than phonon well material 11. Phonon characteristics include velocity of sound ($V_s$), which is proportional to elastic constant, and optical phonon energy. Essentially, an interface between two materials having different $V_s$ and optical phonon energy acts as a barrier which phonons in either material cannot cross. Dashed curve 16 illustrates an estimated phonon distribution within phonon well 11.

Phonon well 11 comprises narrow bandgap layers 17 and wide bangap layer 13. Preferably, barriers 12 also comprise a wide bandgap material so that a charge confinement well, usually called a quantum well, is formed by layers 17. Quantum wells 17 may be formed by other means using additional layers, and it is possible to form a plurality of thin quantum wells as a substitute for each quantum well 17 shown in FIG. 1. Quantum wells 17 provide a ground state energy ($E_0$) illustrated by line 14 near a bottom portion of each quantum well 17. Electrons which are introduced to phonon well 11 can be confined in the ground state, or at higher quantum energy states which lie within quantum wells 17.

An important feature of the present invention is that quantum wells 17 confine electrons in a region of phonon well 11 in which phonon distribution 16 is at a low value. Ideally, electrons will be confined near a minima of phonon distribution 16. In practice, it is believed that significant mobility improvement is achieved simply by confining electrons away from the central portion of phonon well 11, where phonon distribution 16 is at a maximum.

As set out hereinbefore, two adjacent layers in a quantum well structure which have a discontinuity in phonon properties create a phonon barrier. To achieve a phonon distribution 16 which is substantially continuous and has a maximum value in the region of wide bangap layer 13, wide bandgap layer 13 and quantum well layers 17 must comprise materials with closely matched phonon properties. Examples of such materials are indium arsenide (InAs) for quantum well layers 17 and gallium antimonide (GaSb) for wide bandgap layer 13.

Phonon distribution in bulk material is a constant phonon density. Because the present invention confines phonons in phonon well 11, phonon distribution 16 is believed to vary as shown, having a density peak near the center of phonon well 11 and density minima near edges of phonon well 11. It should be understood that in a practical structure phonon distribution 16 will be irregular to some extent even when phonon properties in layers 17 and 13 are closely matched. These irregularities are not believed to substantially lower performance. It is sufficient to the understanding of the present invention, however, to view phonon distribution 16 as a substantially continuous sinusoidal curve, as illustrated in FIG. 1.

Phonons are confined within phonon wells 11 to two dimensions by barriers 12. Electrons are confined within quantum wells 17 to two dimensions by barriers 12 in conjunction with wide bandgap layer 13. It should be clear that the simple structure shown in FIG. 1 and FIG. 2 may be repeated many times to provide stacked structures having many phonon wells 11 and many quantum wells 17.

To conduct charge, some means of supplying charge carriers to quantum wells 17 must be provided. Many such doping techniques are known and are fully compatible with the present invention. Examples include modulation doping, light excitation, or impurity doping, and the like.

Figure 2:
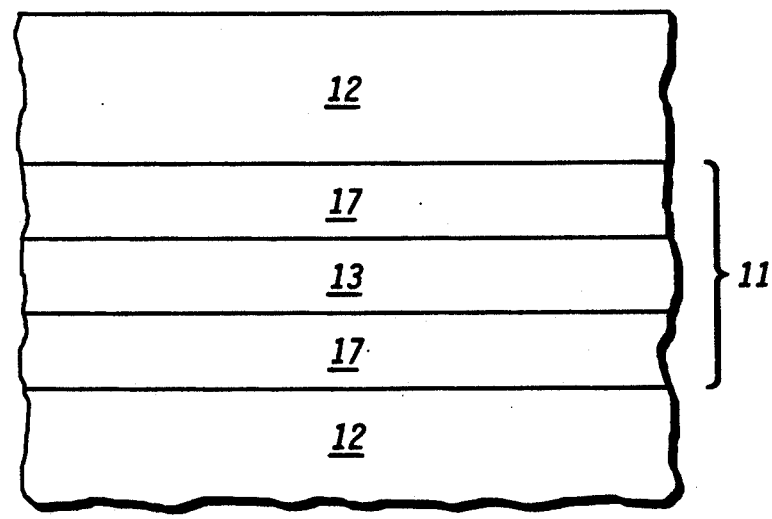
FIG. 2 illustrates, in cross-sectional form, a material structure in accordance with the present invention.

FIG. 2 illustrates a cross-section of a portion of a semiconductor device embodying the present invention. A first barrier layer 12 comprises an essentially single crystal semiconductor such as aluminum antimonide, having a high bandgap energy. First barrier layer 12 is usually formed on a single crystal substrate or buffer layer which provides mechanical support. Thickness of barrier layer 12 is not believed to be critical, although electronic interactions between adjacent phonon wells 11 should be taken into consideration when multiple phonon wells 11 are stacked. A doping layer (not shown) comprising a material such as silicon may be formed in first and second barrier layers 12 to provide modulation doping to phonon well 11. Other means of doping phonon well 11 may also be used, as set out hereinbefore.

First quantum well layer 17 is formed by a process such as epitaxial growth, as are the subsequent layers described hereinafter. The materials chosen in the preferred embodiment all have a zinc blende crystal structure to ease single crystal growth of the multi-layer structure. Other crystal structures, especially the diamond lattice structure and the wurtzite lattice structure, may be used if high grade crystal growth techniques are used. In the preferred embodiment, first quantum well layer 17 comprises InAs and is in the range of 2.5 to 15.0 nanometers thick to ensure two dimensional electron confinement in quantum well 17. InAs has a characteristic bandgap energy of 0.36 eV at a temperature of 300°K, optical phonon energy of 29.6 meV, and a velocity of sound ($V_s$) of $3.84 \times 10^5$ cm/s.

Charge barrier layer 13 comprises a material having a wide bandgap energy compared to quantum well layer 17. An example material is GaSb when InAs is used for quantum well layers 17. GaSb has a characteristic bandgap energy of 0.70 eV at a temperature of 300°K, optical phonon energy of 28.9 meV, and a velocity of sound ($V_2$) of $3.97 \times 10^5$ cm/s. GaSb provides a good match to InAs resulting in a minimal phonon barrier at an interface of charge barrier layer 13 and quantum well layer 17. GaSb also provides a bandgap discontinuity with InAs sufficient to confine electrons in quantum wells 17. It is advantageous to maximize the bandgap difference between charge barrier layer 13 and quantum well layers 17 to maximize carrier confinement, and other material choices may be desirable in some applications to increase bandgap discontinuity even at the expense of slightly degrading the phonon match between charge barrier 13 and quantum well 17. Other material compositions are known which satisfy the bandgap energy and phonon relationships required by the present invention.

Second quantum well layer 17 is formed on top of barrier layer 13. Second phonon barrier 12 is formed covering second quantum well layer 17. Second quantum well layer 17 and second phonon barrier 12 comprise materials with similar composition, bandgap energy, and phonon characteristics as described hereinbefore for first quantum well 17 and first phonon barrier 12. In some applications, it may be desirable to make quantum wells 17 different sizes. Total thickness of phonon well 11 is desirably chosen to provide two dimensional confinement of phonons within phonon well 11.

Although the preferred embodiment is described as structure having two quantum wells 17 for charge confinement, it is possible to form a single quantum well 17. If a single quantum well 17 is used, charge barrier layer 13 should be thicker to balance the phonon well and move the peak phonon density farther from the single quantum well 17. Alternatively, a pair of quantum wells 17 having non-identical thickness may be used to control the relationship between the charge carrier density 14 in the quantum wells and phonon distribution 16. In other words, an alternative embodiment of the present invention comprises an asymmetrical structure having one quantum well 17 of zero thickness or greater, and another quantum well 17 which is in the range of 2.5 to 15 nanometers, for example. It is believed, however, that at least two quantum wells 17 of similar thickness symmetrically positioned at edges of phonon well 11 will provide superior performance.

In operation, charge flows through the multilayer structure shown in FIG. 2 parallel to the layers. Charge flow is primarily in quantum wells 17, while phonon density peaks near the center of barrier layer 13. Stacked structures are easily made by forming a plurality of phonon wells 11 separated by phonon barriers 12.

By now it should be appreciated that a high mobility multilayer semiconductor structure is provided. By positioning a quantum well which confines electrons within a host phonon well, charge carriers in the phonon well can be confined, thus minimizing phonon interactions with charge carriers which degrade mobility in bulk semiconductors. A charge barrier layer which confines charge carriers but is substantially transparent to phonons is formed in the host phonon well, resulting in a substantially sinusoidal phonon density distribution in the host phonon well.

I claim:

1. A quantum well structure comprising: a host phonon confinement well having a substantially continuous phonon distribution; and at least one charge carrier confinement well located near a minima of a phonon distribution providing an uneven distribution of charge carriers throughout the phonon confinement well, the charge carriers concentrated near the minima of the phonon distribution.

2. The quantum well structure of claim 1 wherein the phonon distribution is substantially continuous.

3. The quantum well structure of claim 1 wherein the host phonon confinement well further comprises at least two charge carrier confinement wells separated from each other by a wide bandgap barrier layer.

4. The quantum well structure of claim 3 wherein the wide bandgap barrier layer comprises a material having an optical phonon energy and velocity of sound which closely match that of the charge carrier confinement wells.

5. The quantum well structure of claim 3 wherein the charge carrier confinement wells comprise InAs and the wide bandgap barrier layer comprises GaSb.

6. A quantum well structure comprising: a means for confining phonons in two dimensions having a location of maximum phonon density and minimum phonon density therein; and a means for confining electrons in two dimensions, wherein the means for confining electrons is positioned away from the location of maximum phonon density to provide an uneven distribution of electrons throughout the means for confining phonons, the electrons concentrated near the minimum phonon density.

7. The quantum well structure of claim 6 wherein the means for confining phonons comprises: a first phonon barrier layer; a plurality of phonon well layers covering the phonon barrier layer having similar phonon properties to each other and different phonon properties from the phonon barrier layer; and a second phonon barrier covering the phonon well layers.

8. The quantum well structure of claim 6 wherein the means for confining charge carriers in two dimensions comprises first and second quantum wells separated by a comparatively wide bandgap barrier, wherein the wide bandgap barrier has similar phonon properties to the first and second quantum wells.

9. The quantum well structure of claim 8 wherein the location of maximum phonon density is in the comparatively wide bandgap barrier.

10. A quantum well structure comprising: a buffer layer comprising a first single crystal material; a first phonon barrier layer covering the buffer layer and comprising a second single crystal material having a wide bandgap; a first quantum well layer covering the first barrier layer and comprising a third single crystal material having a narrow bandgap; a charge barrier layer covering the first quantum well layer and comprising a fourth single crystal material having a wide bandgap; a second quantum well layer covering the charge barrier layer comprising the third single crystal material; and a second phonon barrier layer covering the second quantum well comprising the second single crystal material, the first phonon barrier layer and the second phonon barrier layer defining a phonon confinement well comprising a minimum phonon concentration area, and the first quantum well layer and the second quantum well layer defining an uneven distribution of charge carriers within the phonon confinement well, the charge carriers concentrated near the minimum phonon concentration area.

11. The quantum well structure of claim 10 wherein the first, second, and third, fourth single crystal materials having a zinc blende crystal lattice structure.

12. The quantum well structure of claim 10 wherein the first and second phonon barrier layer comprise aluminum antimonide.

13. The quantum well structure of claim 10 wherein the first and second quantum well layers comprise indium arsenide and the charge barrier layer comprises gallium antimonide.

* * * * *